United States Patent [19]

La et al.

[11] Patent Number: 5,761,064
[45] Date of Patent: Jun. 2, 1998

[54] DEFECT MANAGEMENT SYSTEM FOR PRODUCTIVITY AND YIELD IMPROVEMENT

[75] Inventors: Tho Le La; Ying Shiau, both of San Jose, Calif.

[73] Assignee: Advanced Micro Devices, Inc., Sunnyvale, Calif.

[21] Appl. No.: 539,913

[22] Filed: Oct. 6, 1995

[51] Int. Cl.⁶ .................................................. G06F 19/00
[52] U.S. Cl. ........................................ 364/468.17; 364/552
[58] Field of Search ............... 364/468.17, 468.28, 364/488–491, 551.01, 552, 554, 480, 481

[56] References Cited

U.S. PATENT DOCUMENTS

| | | | |
|---|---|---|---|
| 4,878,179 | 10/1989 | Larsen et al. | 364/490 |
| 5,206,582 | 4/1993 | Ekstedt et al. | 324/73.1 |
| 5,355,320 | 10/1994 | Erjavic et al. | 364/488 |
| 5,390,129 | 2/1995 | Rhodes | 364/480 |
| 5,511,005 | 4/1996 | Abbe et al. | 364/552 |
| 5,598,341 | 1/1997 | Ling et al. | 364/468 |

FOREIGN PATENT DOCUMENTS

A-0 654 739 A1  11/1994  European Pat. Off. ........ G06F 11/26

*Primary Examiner*—James P. Trammell
*Attorney, Agent, or Firm*—H. Donald Nelson

[57] ABSTRACT

An automated wafer defect management system in which wafer defect data are collected from wafer inspection instruments, converted into a standard data format and made available through a central database system to workstations for review, analysis, and evaluation.

40 Claims, 11 Drawing Sheets

DEFECT MANAGEMENT SYSTEM FOR PRODUCTIVITY AND YIELD IMPROVEMENT

BACKGROUND OF THE INVENTION

1. Field of the Invention

This invention relates generally to semiconductor wafer manufacturing, and, more particularly, to an automated semiconductor wafer defect management system for productivity and yield improvement.

2. Discussion of the Related Art

Growing technological requirements and the worldwide acceptance of sophisticated electronic devices have created an unprecedented demand for large-scale, complex, integrated circuits. Meeting these demands has required technological advances in materials and processing equipment, significant increases in the number of individuals involved in integrated circuit design, and an increased emphasis on effectively utilizing the computer and other highly sophisticated equipment to aid, not only in the design, but in the analysis of the manufacturing process.

The microscopic dimensions capabilities of current semiconductor manufacturing equipment make possible the design of digital circuits which may be very complex and yet extremely economical in space, power requirements and cost, and which are potentially very fast. At the same time, however, the microscopic dimensions of current semiconductor manufacturing also make it possible for microscopic particles to contaminate and ruin an extended run of wafers before the contamination is discovered causing major economic loss. It is therefore critical that there is a method to discover, not only that there are defects in the wafer manufacturing process, but to determine exactly what is causing those defects. To avoid extensive economic loss it is mandatory to discover these defects as quickly as possible and as close to real time as possible.

The character of the semiconductor industry is such that competition requires that products are designed, manufactured, and marketed in the most efficient manner possible. This has required that improvements in fabrication technology keep pace with the rapid improvements in the electronics industry.

As advances in semiconductor wafer manufacturing technology lead to more sophisticated instruments with improved imaging and analysis capabilities, the volume of data associated with these instruments has grown faster than the ability of standard methods of analysis making wafer defect management on a timely basis problematic.

Present wafer inspection and failure analysis tools provide detailed qualitative and quantitative information about processing defects and the failures caused by them. However, each wafer inspection tool produces information not easily accessible to the production process engineering community. In a well equipped semiconductor wafer manufacturing fab, analytical instruments produce data faster than can be manually analyzed by engineers.

Making semiconductor wafer defect and contamination data available on a timely basis throughout the corporate engineering community has become just as important, if not more important than obtaining the data in the first place.

The problem is exacerbated by the fact that the intelligence (the controls, user interface, and data management capabilities) integrated into each instrument is dedicated to that instrument. Vendors have developed proprietary methods for collecting, processing, storing, and outputting data, and have not established a single set of standards for combining data from multiple vendor equipment. Because of this, engineers have had to use one stand-alone tool at a time making it virtually impossible to efficiently correlate wafer defect information concerning the same wafer.

Because there was no method to correlate wafer defect information, another significant problem was that analytical results was invariably reduced to the form of paper output—even through converted into compact representations such as charts, graphs, or high-resolution images. This reduction to paper was necessary because there was not a method to correlate all the information in one format for efficient presentation. In addition, not only is paper an inefficient medium for distributing information, it is also a serious source of contamination in ultraclean manufacturing environments. Paper fiber, or dust, can contaminate wafers during manufacturing.

Because of the problems associated with wafer defect management the inventors were tasked to obtain an automated system that would network all wafer defect analysis instruments and enable any engineer to access wafer defect data on-line from the engineer's desk without handling paper. After an intensive search the inventors were unable to find an existing solution. The inventors were then tasked to undertake a study to determine the feasibility of developing an automated system.

The first step in the developmental process was to define the functional specifications desired in the system. The final requirements included detailed specifications for every feature and operation of a fully-automated, on-line system.

The first functional specification concerned connectivity. It was determined that an automated system must: (1) provide for the inter-operability of multiple vendor equipment, including the ability to integrate all data and to provide access to the integrated data back to any vendor's review station in its native format; (2) provide a data translation facility to accommodate native data formats, changes, and new tools; and (3) provide total data access time from user workstation or from any vendor's instrument review station of not more than three seconds with multiple users on-line simultaneously.

The second functional requirement concerned data manipulation, charting, and reporting capabilities. The automated system must: (1) allow any combination of data identifier parameters drawn from the workstream (including such parameters as which wafer is being examined, which process technology was used to make the wafer, which inspection device is being used, which layer in the wafer is being examined, and which lot the wafer was from) to be displayed in multiple trend charts and sub-charts simultaneously; (2) allow x-axis and y-axis to be user configurable; and (3) perform statistical calculations automatically for any data combination.

The third functional requirement concerned user interface characteristics. The automated system must: (1) provide a simple, graphical user interface with point-and-click menu options and minimal text entries; (2) allow wafer maps, die maps, and layer images to be overlaid at any magnification (e.g., composite wafer maps of in-line and bitmap data); (3) support filtering options by defect type, defect size, intensity or other user-specified data type; and (4) display multiple bitmap images and electrical failure "bin" data simultaneously, allowing access to defect images and analysis data through wafer maps.

The final functional requirement concerned system security, safety, and maintenance. It was determined that the system must: (1) provide for password security access by type of user, such as technician, engineer, or systems administrator; (2) provide automatic back-up data integrity in case of system (computer or storage) failure, power outage, or network crash; and (3) support remote system and network administration.

The development and installation of an automated system would be beneficial in many ways, including the following examples, it would save the time and cost expended by technicians gathering information for the engineers and, most importantly, increase product yields due to a faster determination that defects were occurring allowing a faster determination of the defect causes and thus a faster correction of the defect causes.

In addition, by improving the flow of meaningful information, learning is accelerated within the production cycle. Corrective action can be taken more quickly in resolving the causes of defects and failures, accelerating the time it takes to reach optimum yield in a new facility or with a new process technology.

SUMMARY OF THE INVENTION

According to the present invention, the foregoing advantages are attained by an automated wafer defect management system in which wafer defect data are collected from wafer inspection instruments, converted into a standard data format, and transferred to a central database system.

In accordance with another aspect of the invention user interface workstations are provided such that users can select information and have it transferred to the workstation for review. The user at each workstation can have the workstation create statistical and graphical representations of the selected data for review at the workstation. The user can select a single or multiple overlaid statistical and graphical representations by pointing-and-clicking on a data point in a displayed chart. The format for display can be selected by the user and can be a trend chart, an optical image, a secondary electron microscope image, a wafer map, a tool comparison chart or a Pareto chart or a combination of any of the above shown in a Windows™ display.

In accordance with a further aspect of the invention wafer defect data are transferred to data analysis stations which perform detailed analysis of the wafer defect data and return the analyzed data to the central database system. The data analysis stations include the capability for defect classification, image capture, surface/cross-section analysis, and spectral analysis. The detailed analysis generated by the data analysis stations is also available for review, study, and evaluation at each workstation.

The central database system is made up of a relational database installed on a server with memory to store the wafer defect data. The relational database organizes the wafer defect data in tables where it is tagged according to preselected criteria. The preselected criteria includes process technology, layer, lot, wafer, device, process equipment identification, and scan tool identification. The central database system can access databases containing electrical test results and in-line process monitor and equipment monitor information which is correlated to the pertinent wafer defect data. This correlated data is available for review at the user interface workstations.

Still other aspects of the present invention will become readily apparent to those skilled in the art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION OF THE PREFERRED EMBODIMENTS

Figure 1A:
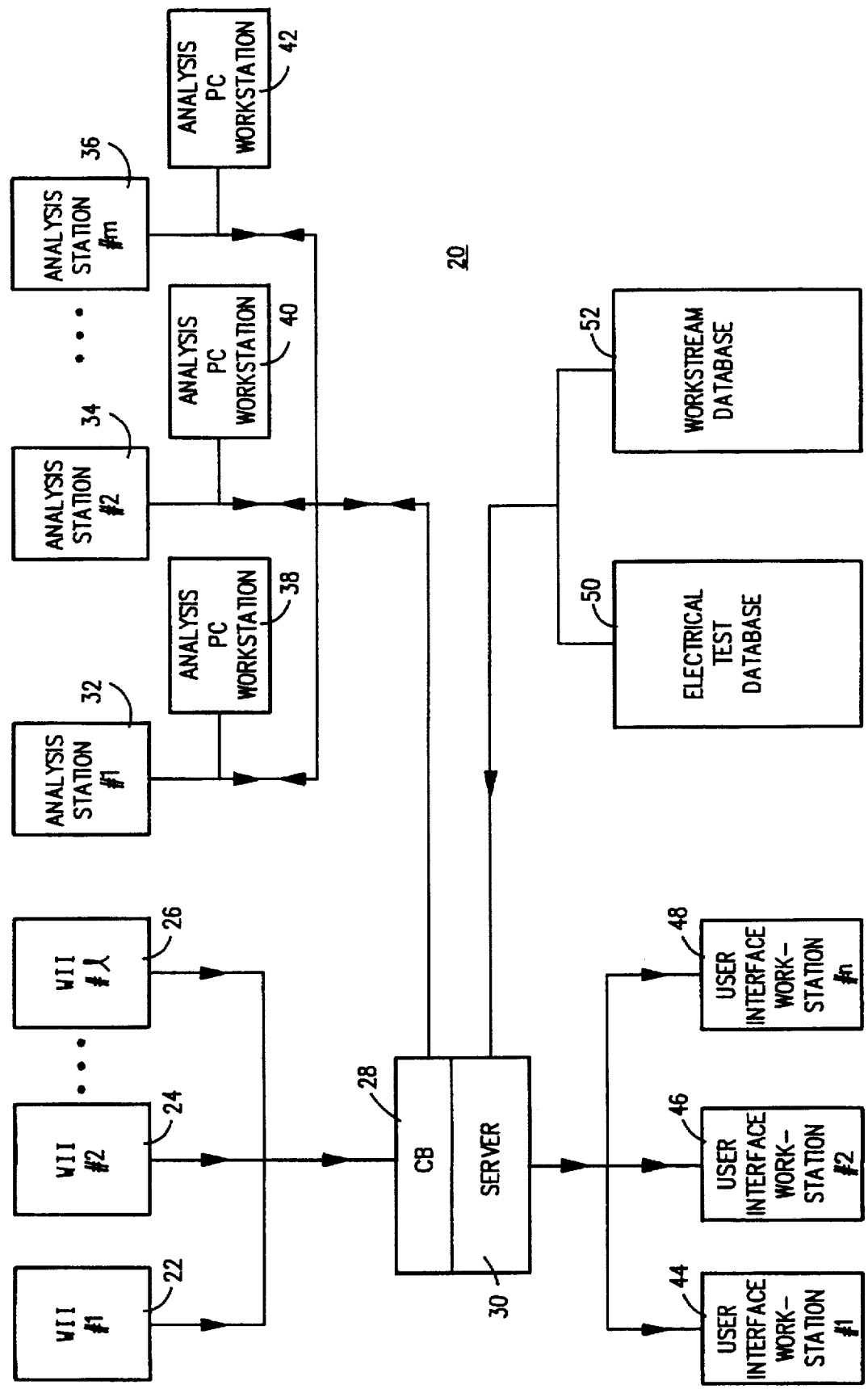
FIG. 1A shows a first embodiment of the automated wafer defect management system of the present invention.

One embodiment of the present invention is illustrated in FIG. 1A. In this embodiment there is shown a wafer defect management system 20. In this embodiment there is shown wafer inspection instrument (WII #1) 22, wafer inspection instrument (WII#2) 24, and wafer inspection instrument (WII #1) 26 representing that multiple wafer inspection instruments may be connected to the system. The wafer inspection instruments 22,24,26 are connected to a conversion box (CB) 28 which is shown connected to server 30. This embodiment also shows analysis station (#1) 32, analysis station (#2) 34, and analysis station (#m) 36 representing that multiple analysis stations may be connected to the system. Each analysis station may have associated with it an analysis PC workstation as shown at 38, 40 and 42. This embodiment also shows user interface workstation (#1) 44, user interface workstation (#2) 46, and user interface workstation (#n) 48 representing that multiple user interface workstations may be connected to the system. An electrical test database 50 and a workstream database 52 are also shown connected to the server 30.

Figure 1B:
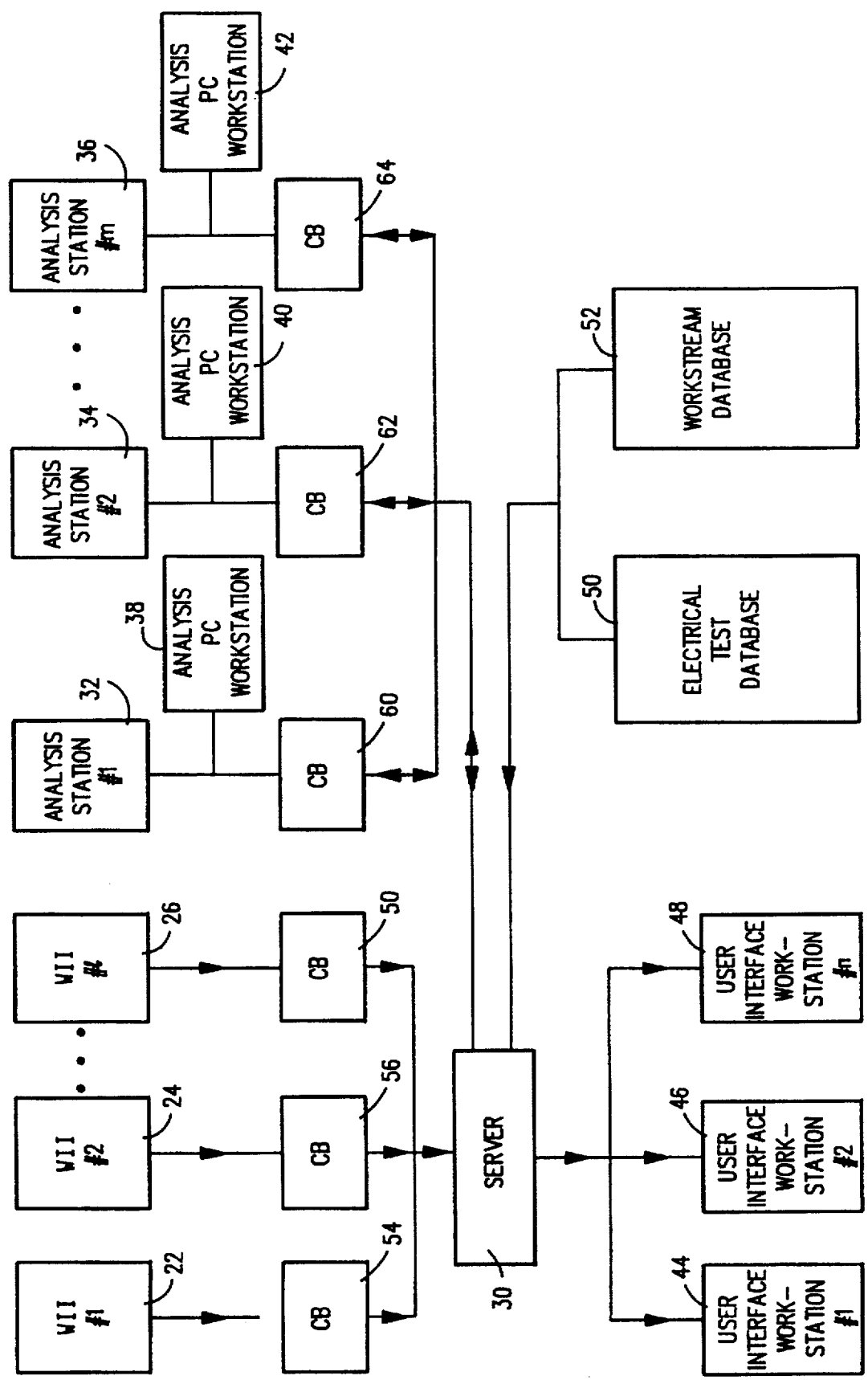
FIG. 1B shows a second embodiment of the automated wafer defect management system of the present invention.

FIG. 1B shows another embodiment of the present invention similar to the embodiment shown in FIG. 1A and wherein like component have the same numerical designations. In the embodiment shown in FIG. 1B there are shown conversion boxes 54,56,58 associated with wafer inspection instruments 22,24,26 respectively and conversion boxes 60,62,64 associated with analysis stations 32,34,36 respectively. The conversion boxes 64 are desktop computers equipped with specialized hardware and software to translate all the information provided by each attached instrument into a standard format. In addition, the conversion boxes 54–64 handle video data digitizing, file transfer and communications between each attached instrument and the server 30. Software in the respective conversion boxes 54–64 converts data from the attached instrument's native format into a standard Transmission Control Program/Internet Protocol (TCP/IP) format. The respective conversion box 54–64 then transfers the data using TCP/IP's File Transfer Protocol (FTP) to the server 30. The specialized software for the various aspects and components of the data management system is available from INSPEX, Inc., Billerica, Mass.

Figure 2:
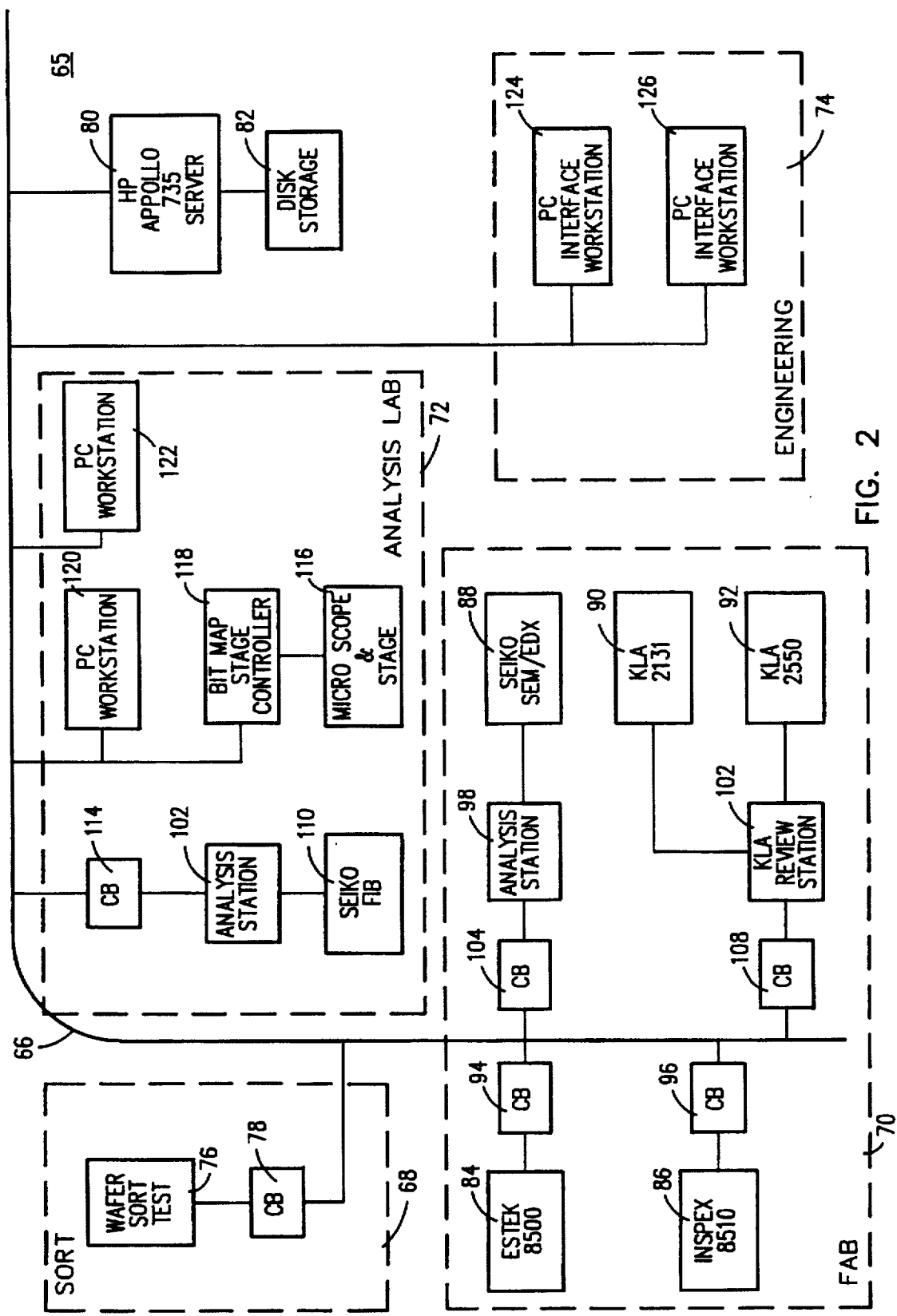
FIG. 2 shows an embodiment of the automated wafer defect management system showing representative components in accordance with the present invention.

Referring now to FIG. 2 there is shown a representative defect wafer management system 65 utilizing the teaching of the present invention and is considered by the inventors as the best mode of the invention as of the filing date. This embodiment utilizes an ethernet backbone 66 to network a sort station 68, a fab 70, an analysis lab 72, and engineering 74. A wafer sort test station 76 sorts and tests wafers and sends data via conversion box 78 and Ethernet 66 to server 80. Server 80 in the representative system 65 is a Hewlett Packard (HP) Apollo 735 server running Oracle Version 7.0 database. Oracle Version 7.0 was chosen for representative system 65 because of its powerful relational database. As can be appreciated other equivalent servers could be used as well as other equivalent database software programs. Disk storage 82 consists of ten gigabytes and provides data record access time of less than 15 ms.

The wafer inspection instruments in the Fab 70 comprise an Estek 8500 shown at 84, an Inspex 8510 shown at 86, a Seiko SEM/EDX (scanned electron microscopy/energy dispersive x-ray) shown at 88, a KLA 2131 shown at 90, and a KLA 2550 shown at 92. The Estek instrument 84 and the Inspex 86 instrument each have a conversion box 94,96 respectively, each connected to Ethernet 66. The Seiko 88 instrument has an analysis station 98 which is connected to Ethernet 66 via a conversion box 104. The KLA 2131 instrument 90 and the KLA 2550 instrument 92 share a review station 102 which is connected to Ethernet 66 via conversion box 108. The KLA 2131 instrument 90, the Inspex 8610 instrument 86, and the Estek 8500 instrument 84 are wafer scanning tools which detect defects and anomalies in the wafers. KLA 2550 review station 92 is an optical microscopic review tool to review and capture optical images of defects on a wafer after the wafer has been scanned by an inspection station. The analysis stations 102,98 are analytical tools to perform surface analyses and cross-section analyses (by ion-milling) and can provide electron and ion micrographs of defects and can perform compositional analysis of defects.

Analysis lab 72 shows a Seiko FIB 110 with an analysis station 112 and a conversion box 114 connected to Ethernet 66 and a microscope & stage unit 116 connected to a bitmap stage controller 118 which is connected to Ethernet 66. Analysis lab 72 also shows PC workstations 120 and 122 connected to Ethernet 66.

Engineering 74 show two PC user interface workstations 124 and 126 connected to Ethernet 66. As discussed above Engineering 74 can support multiple user interface workstations which can be distributed throughout the corporation limited only by the availability of an Ethernet 66 connection.

The operation of representative system 68 is as follows. The central database system installed on server 80 acquires information in real time from every inspection and analysis tool in use throughout system 68. Data is stored in tables organized according to how it is called up by the user interface and tagged according to: process technology, layer, lot, wafer, device, process equipment identification, and scan tool identification. Data is automatically backed-up and archived by the Oracle software installed on server 80. A partial archive is taken daily and a full archive tape is removed from the system once each month.

The PC user interface workstations 124,126 are 486-based workstations running Windows™. These workstation are configured with 8 Mb of memory, at least a 120 Mb hard drive, an Ethernet card running TCP/IP and FTP software, and SQL*NET.

Unformatted data move across the network efficiently in TCP/IP packets to and from the Oracle database, and to the workstations 120,122,124,126 where custom software created by Inspex creates graphic representations and statistical calculations independently of both the network and the central database. Off-loading the graphical processing from the server onto the respective workstation provides for the fastest user response time while at the same time conserving network resources.

Workstations 120,122,124,126 receive user selected wafer data from the central database server 80. Then, using a point-and-click graphical interface, the user can view the selected data as trend charts, images, wafer maps, tool comparisons and Pareto charts. The data retrieval operations and graphical presentations are generated on workstations 120,122,124,126 in less than three seconds. The complex processing operation of accessing wafer maps from a trend chart, which is handled entirely by the workstation, executes in under five seconds. This performance is obtained by sharing database functions between the server 80 and workstations 120,122,124,126, and by performing all graphics imaging and data manipulation on the respective workstation.

Because each workstation has the capability of displaying multiple graphical representations there is no need to create a paper record. The only need for a paper report is for management reporting purposes and a paper report can be printed outside the clean room environment. Trend charts and other graphical representations of the data can be selected on the desktop workstations by mouse-driven or menu options commands. Text data fields are also provided, with textual data becoming part of the wafer defect database.

Figure 3:
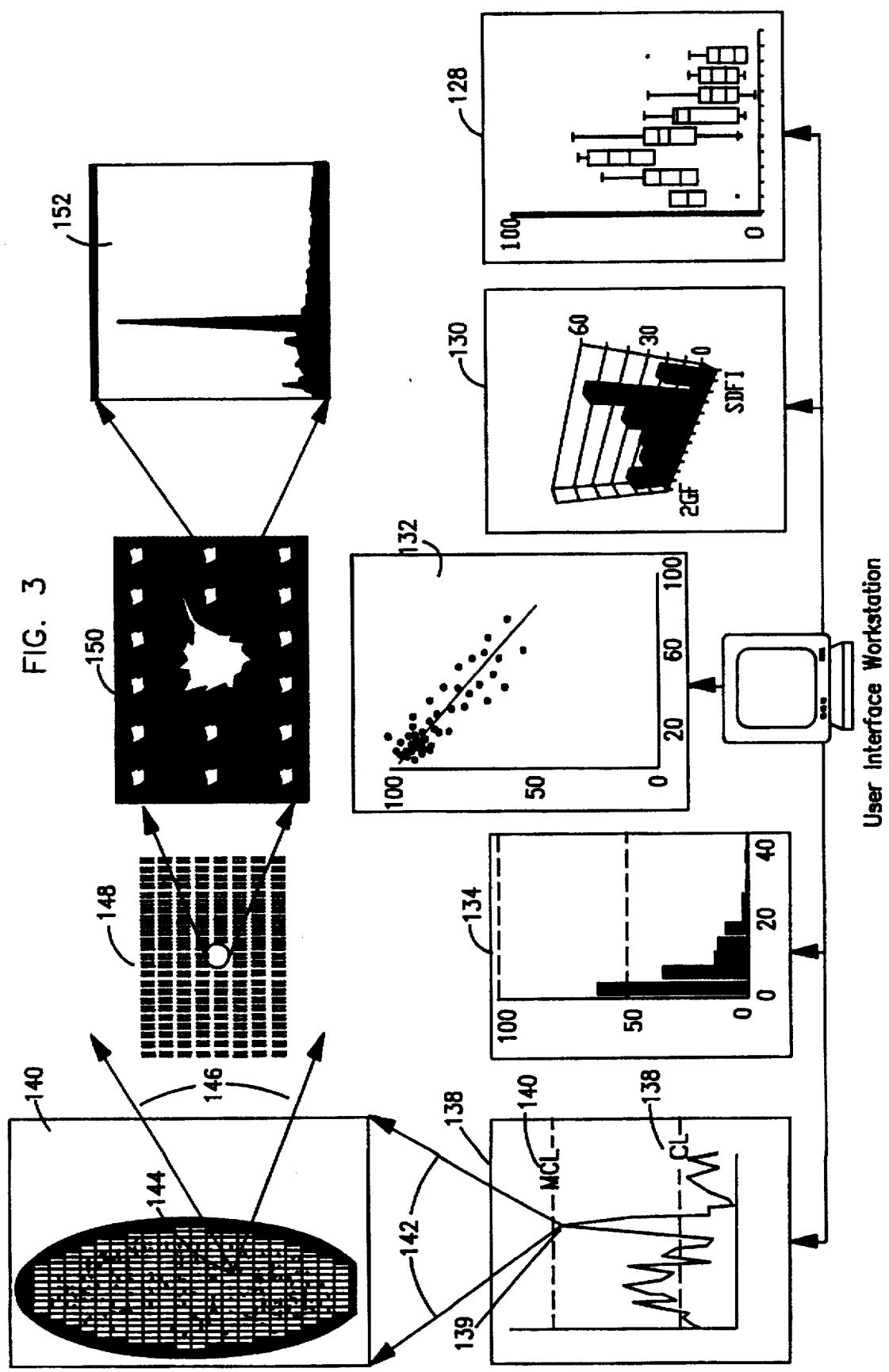
FIG. 3 shows selected display attributes provided by the present invention.

Referring now to FIG. 3, there is shown a representation of the information that is obtainable by a user at a user interface workstation. The user can select specific wafer defect data that needs to be examined. The user can chose a box plot 128 which compares defect level of any inspected layer between different lots or for different workweeks, a stacked bar chart 130 which shows defect level distribution of inspected layers, a yield to defect density correlation chart 132 which is an x-y scatter plot of wafer sort yield versus defect density, a defect Pareto chart 134 which shows defect type distribution of inspected layers in a given time frame, or a statistical process control chart (SPC) 136 where x-axis represents lot ID's and the y-axis represents percent bad die. CL 138 is the center line which is equal to the average of all data points in the chart. UCL 140 is the upper control limit which is equal to CL+3*standard deviation. The SPC 136 is monitored closely for indications of problem lots which are indicated by any data point above UCL 140. Once a problem is detected on the SPC 136 the user double clicks on the data point on the chart, for example, data point 139 on SPC 136. This generates the pertinent defect wafer map 140. The arrows 142 indicate that the defect wafer map 140 is generated by double-clicking on data point 139. The defect wafer map shows each individual die and a dot on each die in which there is a defect. The user can select any defect on any die for further examination by double-clicking on that defect. For example, defect wafer map 140 shows a representative defect 144 which has been double-clicked (indicated by arrows 146) for further examination. The next chart generated is a defect optical image chart 148 of the defect in the selected die. The next chart generated is a scanning electron microscope (SEM) image 150. The user can then select a spectral analysis chart 152 of the wafer defect selected.

From any defect trend chart, the user at a user interface workstation can click on the chart to request wafer defect maps from the processing lot being analyzed. From the defect map, any analysis performed on the subject defect, i.e., SEM (scanning electron microscopy) or FIB (focused ion beam) images, EDX (energy dispersive x-ray) elemental analysis or FIB milling results, are available within seconds. The user merely clicks on the desired choice to move from screen to screen, as shown in FIG. 3.

Figure 4:
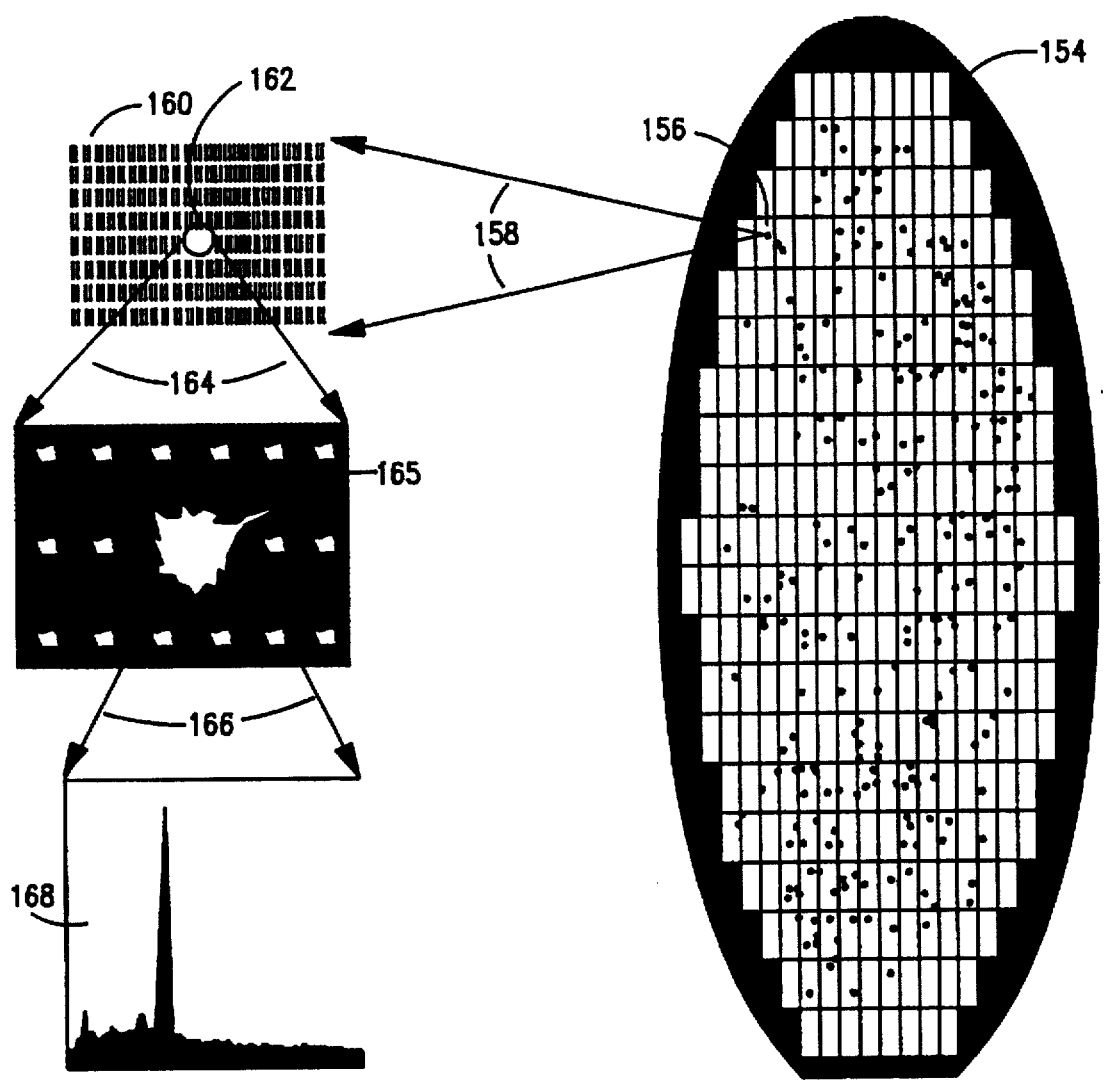
FIG. 4 illustrates the point-and-click capabilities of the present invention.

FIG. 4 is a larger scale illustration of the wafer defect map shown in FIG. 3 and the possible graphical representations that can be selected by the user. From defect wafer map 154, the user can select any defect for further examination. For example, the defect shown at 156 is selected for further examination by double-clicking on the defect represented by arrows 158. This generates defect optical image 160. By double-clicking on the optical image defect shown at 162 represented by arrows 164 a scanning electron microscope (SEM) image 165 is generated. By double-clicking on the SEM image defect, represented by arrows 166 a spectral analysis of the defect 168 is generated.

Figure 5:
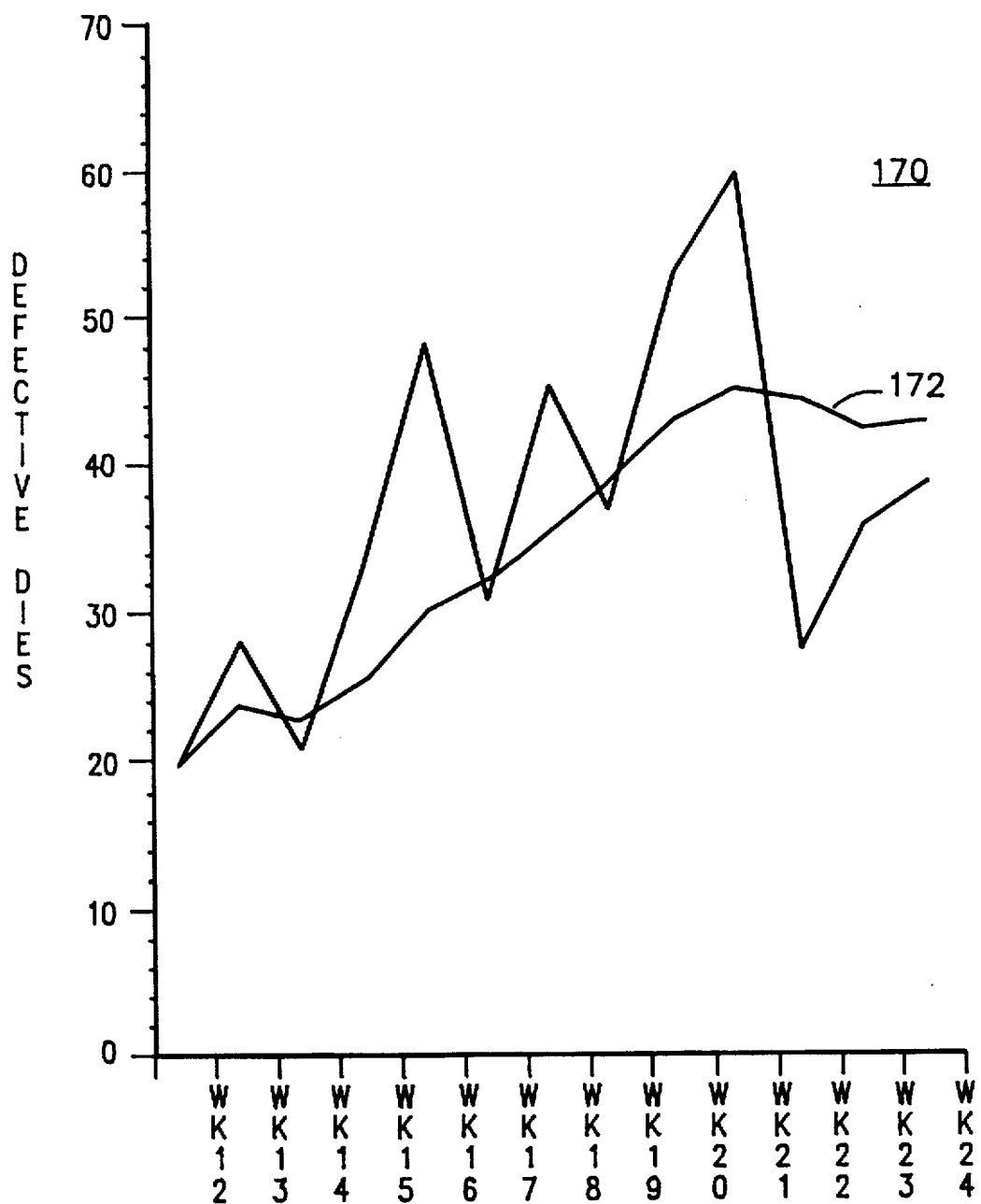
FIG. 5 shows a layer trend chart for percent bad dies per week.

FIG. 5 shows a layer trend chart for percent bad dies 170. The x-axis shows weeks and the y-axis show percent defective dies. The layer trend chart 170 can be generated for various parameters such as which scan tools were utilized, which process technology was used, and for layer. In addition, a moving average is indicated at 172.

Figure 6:
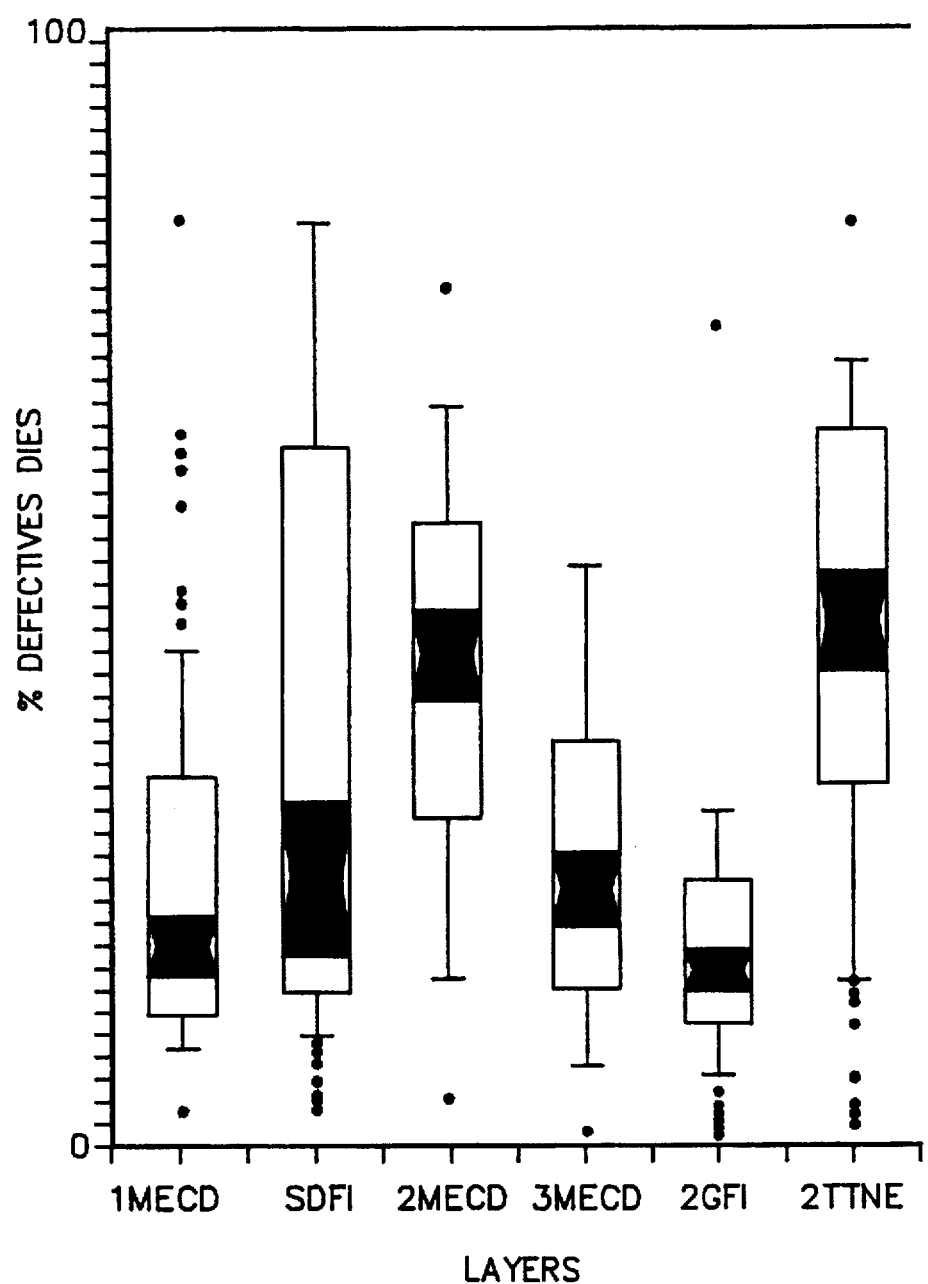
FIG. 6 shows a box chart for percent bad dies per layer in the wafer.

FIG. 6 is a box chart for percent bad dies with the x-axis indicating layers and the y-axis indicating percent defective dies. The box chart can be generated for specific parameters, such as which scan tools, which process technology, device, and which layers.

Figure 7:
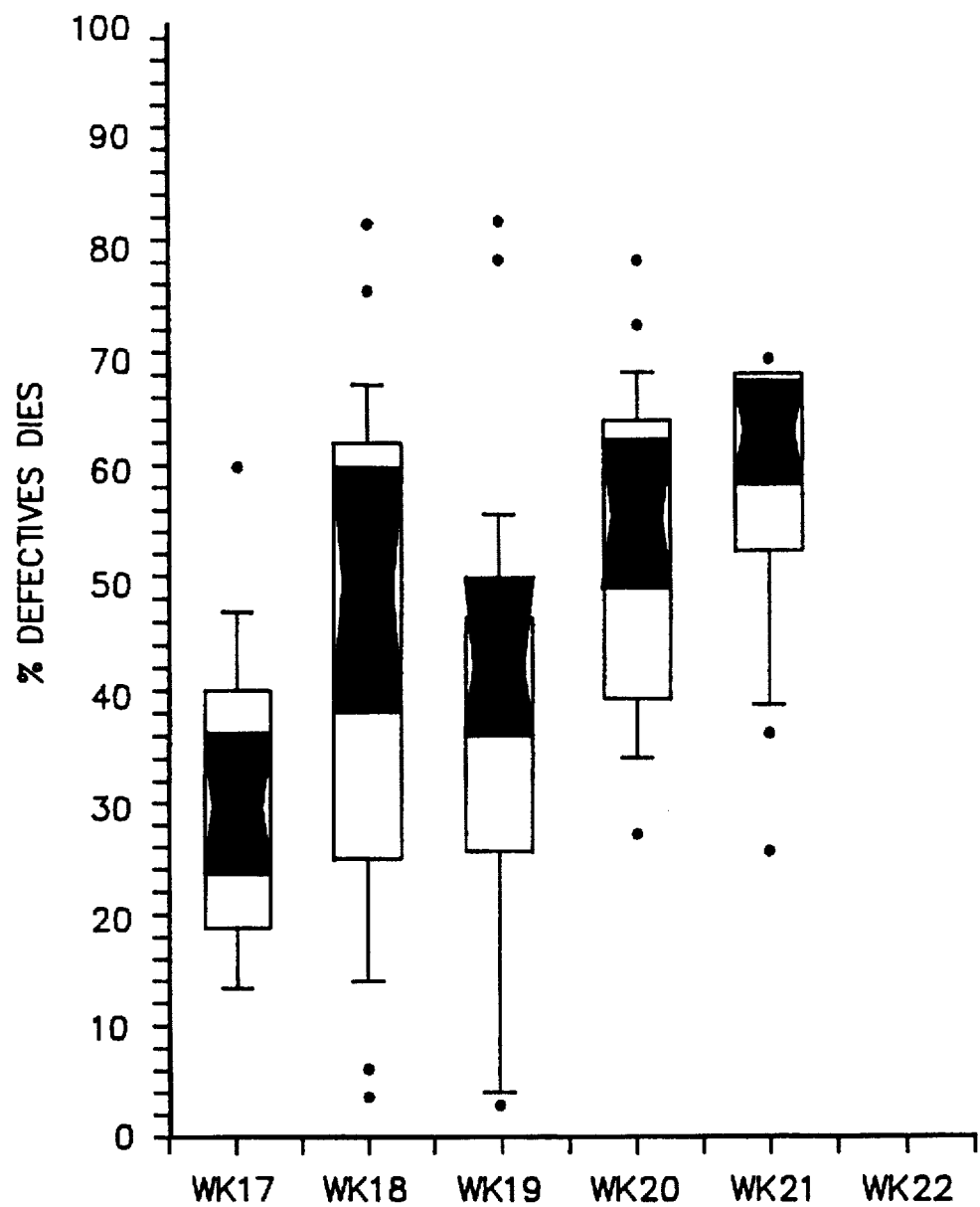
FIG. 7 shows a box chart for percent bad dies per week.

FIG. 7 is a box chart similar to the box chart of FIG. 6, however, the box chart in FIG. 7 has the x-axis showing weeks and the y-axis showing percent defective dies. The parameters are the same except that the chart is generated using a specific layer.

Figure 8:
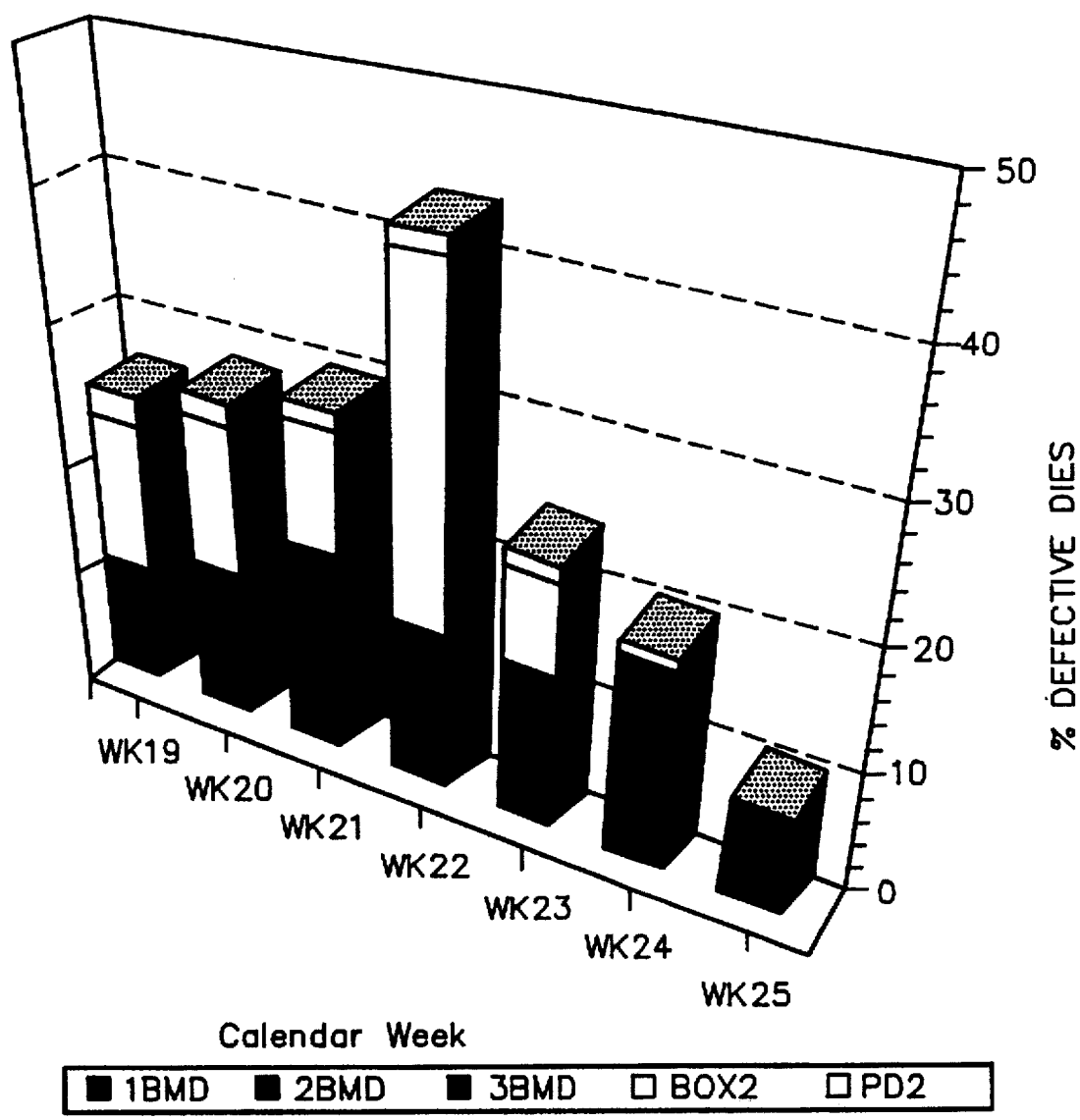
FIG. 8 shows a layer comparison chart for percent bad dies per week.

FIG. 8 shows a layer comparison chart for percent bad dies with the x-axis showing weeks and the y-axis showing percent defective dies. Again the chart can be generated with specified parameters such as which scan tools, which process technology, and which devices were utilized.

Figure 9:
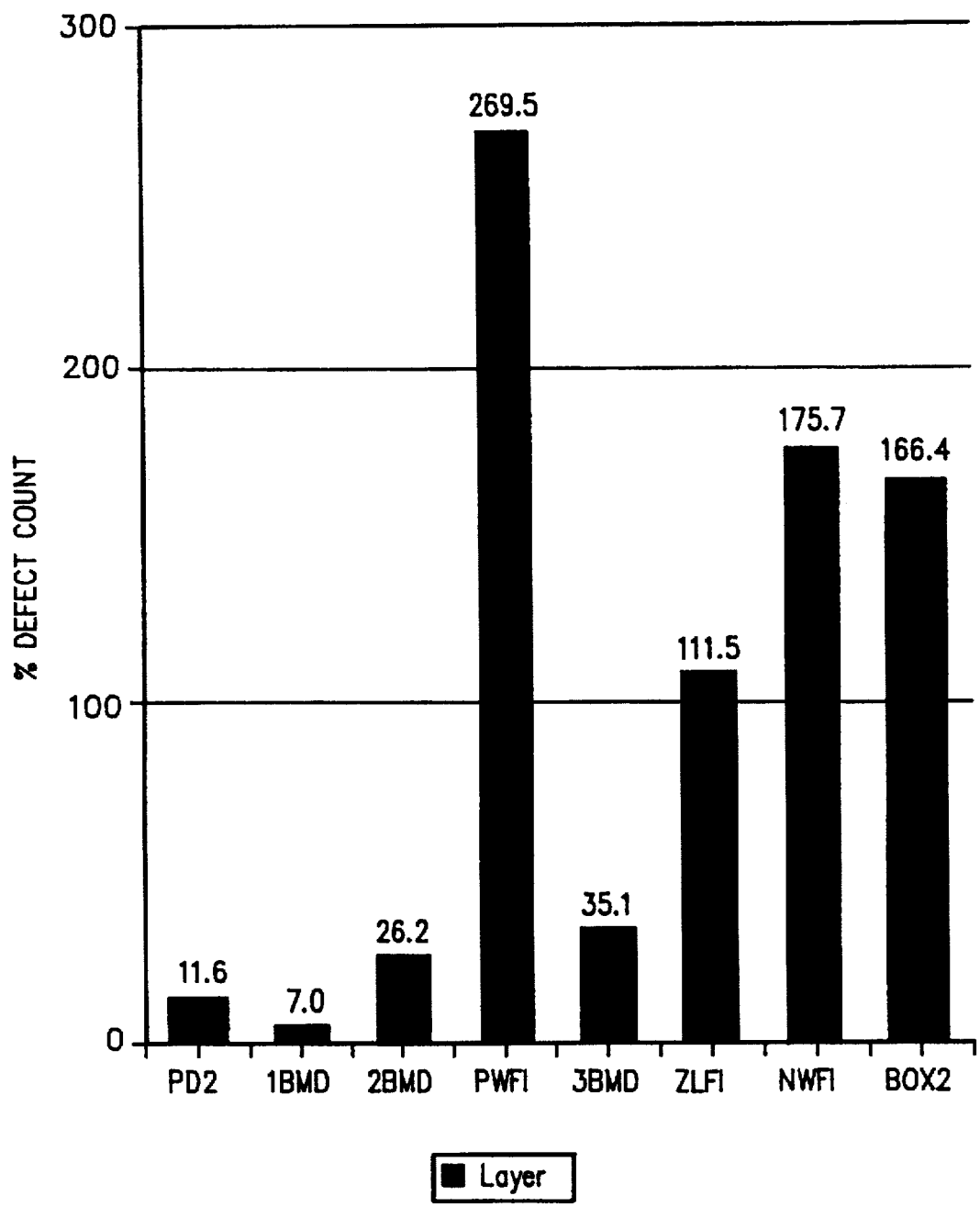
FIG. 9 shows a layer bar chart for defect count per layer.

FIG. 9 shows a layer bar chart for defect count per layer. The x-axis shows layers and the y-axis shows number of defect count. The parameters for the chart can be selected by the user and include which scan tools, which process technology, and which devices.

Figure 10:
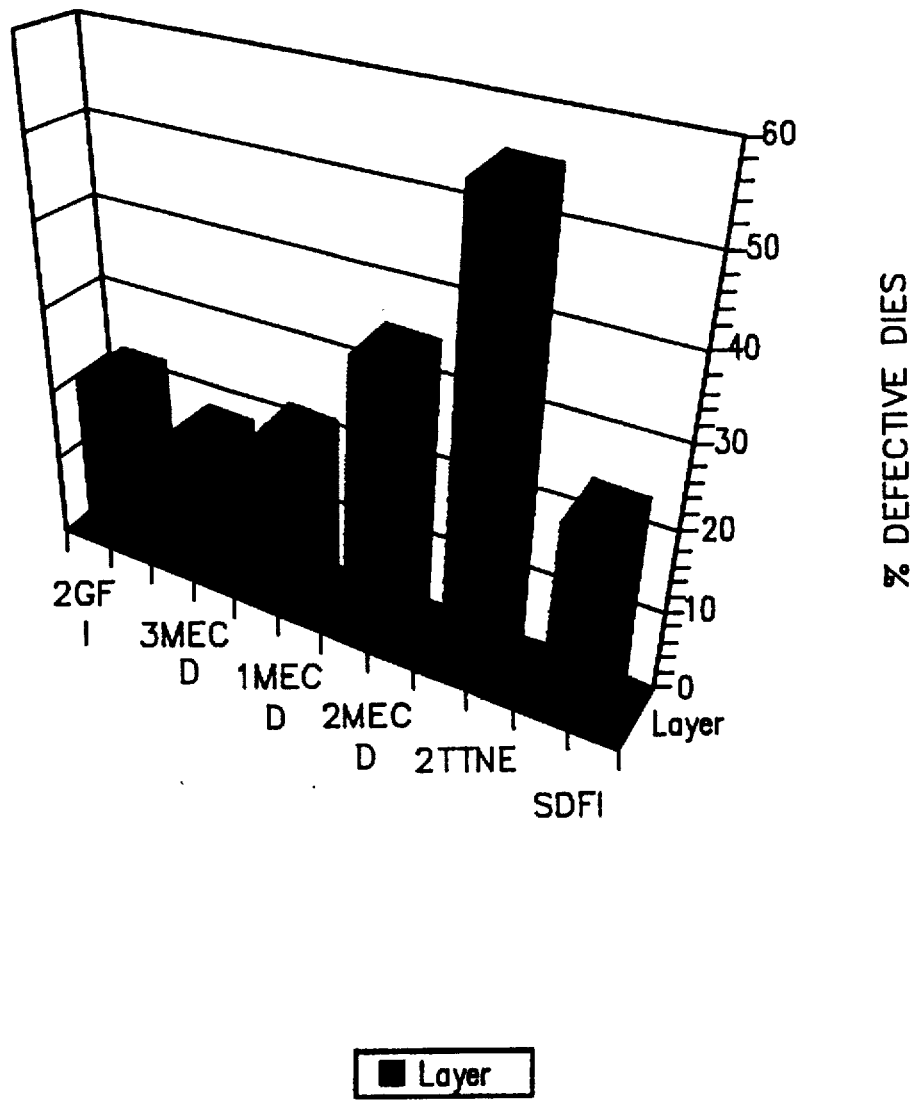
FIG. 10 shows a layer bar chart for percent bad dies per layer.

FIG. 10 shows a layer bar chart for percent bad dies with the x-axis showing layers and the y-axis showing percent defective dies. The parameters for this chart can be selected and in this chart include which scan tools, which process technology, and which devices.

The foregoing description of the preferred embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. An automated wafer defect data management system, comprising:

multiple wafer inspection instruments;

multiple wafer analysis tools;

means for collecting wafer defect data from multiple defects on wafers from each of said multiple wafer inspection instruments and said multiple wafer analysis tools;

conversion means associated with each of the multiple wafer inspection instruments and each of the multiple wafer analysis tools for converting the collected wafer defect data from each of said multiple wafer inspection instruments and said multiple wafer analysis tools from an instrument and tool specific format to a standard format;

a central database system with means for storing converted wafer defect data wherein the stored converted wafer defect data is retrievable based on selected criteria;

at least one user interface workstation wherein user selected converted wafer defect data can be analyzed in real time; and means for transferring user selected converted wafer defect data from the central database system to the at least one user interface workstation.

2. The system as in claim 1, wherein said central database system comprises:

a server;

a relational database installed on said server for organizing said converted wafer defect data in tables wherein aid converted wafer defect data is tagged according to preselected criteria; and wherein said means for storing converted wafer defect data comprises a memory associated with said server to store said converted wafer defect data and said tables.

3. The system as in claim 2, wherein said at least one interface workstation includes:

means for creating statistical and graphical representations from said user selected converted wafer defect data; and means for displaying said representations.

4. The system as in claim 3, further comprising:

at least one data analysis station;

means for transferring user selected converted wafer defect data to said at least one data analysis station;

means for analyzing said converted wafer defect data at said at least one data analysis station; and means for transferring analyzed wafer defect data to said central database system.

5. The system as in claim 4, further comprising means for converting user selected converted wafer defect data to an instrument specific format required by said at least one data analysis station.

6. The system as in claim 5, further comprising:
means for transferring user selected analyzed wafer defect data to said at least one user interface workstation.

7. The system as in claim 6, wherein said workstation includes said means for creating said statistical and graphical representations.

8. The system as in claim 7, wherein said means for creating said statistical and graphical representations is independent of said central database system.

9. The system as in claim 8, wherein said means for creating said statistical and graphical representations includes a point-and-click graphical interface system allowing said user selected analyzed data to be selectively displayed in at least one format selected from the group consisting of a trend chart, an image, a wafer map, a tool comparison, or a Pareto chart.

10. The system as in claim 9, wherein said preselected criteria includes process technology, layer, lot, wafer, device, process equipment identification, and scan tool identification.

11. The system as in claim 10, wherein said data analysis station includes means for defect classification, image capture, surface/cross-section analysis, and spectral analysis.

12. The system as in claim 11, further comprising means for accessing an electrical test database.

13. The system as in claim 12, further comprising means for accessing an in-line process monitor and equipment monitor database.

14. The system as in claim 13, wherein said central database system further comprises means for correlating said user selected analyzed data with said electrical test data and said in-line process monitor and equipment monitor data.

15. The system as in claim 14, further comprising means for providing password security access by type of user.

16. The system as in claim 15, further comprising means for an automatic backup data integrity.

17. The system as in claim 16, wherein said means for transferring comprises a computer network.

18. An automated wafer defect data management system, comprising:
multiple wafer inspection instruments;
multiple wafer analysis tools;
a central database system;
a network for transferring wafer defect data from multiple defects on wafers generated at each of the multiple wafer inspection instruments and each of the multiple wafer analysis tools to the central database system;
a converter associated with each of the multiple wafer inspection instruments and each of the multiple wafer analysis tools to convert the wafer defect data generated at each of the multiple wafer inspection instruments and each of the multiple wafer analysis tools from an instrument and tool specific format to a standard format;
a memory associated with the central database system to store the converted wafer defect data wherein the stored converted wafer defect data is retrievable via the network based on selected criteria; and
at least one user interface workstation wherein user selected converted wafer defect data can be analyzed in real time.

19. The system as in claim 18, wherein said central database system includes:

a server; and
a relational database installed on said server for organizing said converted wafer defect data in tables wherein said converted wafer defect data is tagged according to preselected criteria.

20. The system as in claim 19, wherein said at least one user interface workstation creates statistical and graphical representations from said user selected converted wafer defect data and wherein said at least one user interface workstation further includes a display to display said representations.

21. The system as in claim 20, further comprising at least one data analysis station wherein said converted wafer defect data is analyzed and wherein said user selected converted wafer defect data is transferred to and from said at least one data analysis station and to said central database system by said network.

22. The system as in claim 21, further comprising at least one converter to convert user selected converted wafer defect data to an instrument specific format required by said at least one data analysis station.

23. The system as in claim 22, wherein said analyzed wafer defect data is transferred to said at least one user interface workstation by said network.

24. The system as in claim 23, wherein said user interface workstation includes a point-and-click graphical interface to allow said user selected analyzed data to be selectively displayed in at least one format selected from the group consisting of a trend chart, an image, a wafer map, a tool comparison, or a Pareto chart.

25. The system as in claim 24, wherein said preselected criteria includes process technology, layer, lot, wafer, device, process equipment identification, and scan tool identification.

26. The system as in claim 25, wherein said data analysis station performs defect classification, image capture, surface/cross-section analysis, and spectral analysis.

27. The system as in claim 26, further comprising a system to access an electrical test database.

28. The system as in claim 27, further comprising a system to access an in-line process monitor and equipment monitor database.

29. The system as in claim 28, wherein said central database system correlates said user selected analyzed data with said electrical test data and said in-line process monitor and equipment monitor data.

30. The system as in claim 29, comprising a system to provide password security access by type of user.

31. The system as in claim 30, further comprising a system to perform an automatic backup of said data.

32. A method of automating wafer defect data management, the method comprising:
collecting wafer defect data from multiple defects on wafers from multiple wafer inspection instruments;
collecting wafer defect data from multiple defects on wafers from multiple analysis tools;
transferring the collected wafer defect data from the multiple wafer inspection instruments and the multiple wafer analysis tools to a central database system via a network;
converting the collected wafer defect data from the multiple wafer inspection instruments and the multiple wafer analysis tools from an instrument and tool specific format to a standard format;
storing the converted collected wafer defect data in a memory associated with the central database system wherein the converted collected wafer defect data is retrievable based on selected criteria; and analyzing selected converted collected wafer defect data in real time at at least one user interface workstation.

33. The method of claim 32, further comprising the step of organizing said converted wafer defect data in tables in a relational database installed on a server in said central database system wherein said converted wafer defect data is tagged according to preselected criteria comprising process technology, layer, lot, wafer, device process equipment identification, and scan tool identification.

34. The method of claim 33, further comprising the steps of: creating statistical and graphical representations from said user selected converted wafer defect data; and displaying said representations at said user interface workstation.

35. The method of claim 34, further comprising the steps of:

transferring said selected converted wafer defect data to a data analysis station;

analyzing said selected converted wafer defect data at the data analysis station; and transferring said analyzed selected converted wafer defect data to said central database system by said network.

36. The method of claim 35, further comprising the steps of:

transferring said analyzed selected converted wafer defect data to said user interface workstation by said network; and displaying said user selected analyzed data in a format selected from the group consisting of a trend chart, an image, a wafer map, a tool comparison, or a Pareto chart.

37. The method of claim 36, further comprising the step of performing defect classification, image capture, surface/cross-section analysis, and spectral analysis.

38. The method of claim 37, further comprising the steps of:

accessing an electrical test data base;

accessing an in-line process monitor and equipment monitor database; and correlating information from said electrical test data base and information from said equipment monitor database with said user selected analyzed data.

39. The method of claim 38, further comprising the step of providing password security.

40. The method of claim 39, further comprising the step of performing an automated backup of said memory in said central database system.

* * * * *